United States Patent
Link et al.

(10) Patent No.: US 10,298,109 B2
(45) Date of Patent: May 21, 2019

(54) SWITCH-MODE POWER SUPPLY CONTROL

(71) Applicant: STMicroelectronics (Rousset) SAS, Rousset (FR)

(72) Inventors: Jean-Francois Link, Trets (FR); Vincent Onde, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/949,690

(22) Filed: Apr. 10, 2018

(65) Prior Publication Data
US 2018/0323695 A1 Nov. 8, 2018

(30) Foreign Application Priority Data
May 3, 2017 (FR) ...................................... 17 53897

(51) Int. Cl.
*H02M 1/08* (2006.01)
*H03K 4/08* (2006.01)
*H03K 3/017* (2006.01)
*H03K 7/08* (2006.01)
*H02M 1/00* (2006.01)

(52) U.S. Cl.
CPC .............. *H02M 1/08* (2013.01); *H03K 3/017* (2013.01); *H03K 4/08* (2013.01); *H03K 7/08* (2013.01); *H02M 2001/0012* (2013.01); *H02M 2001/0029* (2013.01)

(58) Field of Classification Search
CPC ........... H02M 1/08; H02M 2001/0029; H02M 2001/0012; H03K 4/08; H03K 3/017; H03K 7/08

USPC ......................................... 323/281–289, 315
See application file for complete search history.

(56) References Cited

U.S. PATENT DOCUMENTS

| | | | |
|---|---|---|---|
| 3,689,914 A | 9/1972 | Butler | |
| 4,544,911 A | 10/1985 | Altman et al. | |
| 6,337,788 B1 * | 1/2002 | Balakrishnan | F16D 31/02 361/71 |
| 6,580,593 B2 * | 6/2003 | Balakrishnan | H02H 3/06 361/18 |
| 8,194,421 B2 * | 6/2012 | Djenguerian | H02M 3/33507 363/21.12 |

(Continued)

FOREIGN PATENT DOCUMENTS

| | | |
|---|---|---|
| DE | 102013111844 A1 | 4/2014 |
| EP | 0838904 A1 | 4/1998 |
| WO | 2014008291 A1 | 1/2014 |

OTHER PUBLICATIONS

INPI Search Report and Written Opinion for FR 1753897 dated Feb. 7, 2018 (8 pages).

(Continued)

*Primary Examiner* — Fred E Finch, III
*Assistant Examiner* — Nusrat Quddus
(74) *Attorney, Agent, or Firm* — Crowe & Dunlevy

(57) ABSTRACT

A control signal is applied to a pulse generating circuit configured to generate pulses that are modulated in width. A circuit provides for slope-compensation of the control signal. The circuit includes a digital-to-analog converter that generates a decreasing sawtooth signal. A triggering circuit operates to trigger steps of the sawtooth signal and resetting the sawtooth signal. The sawtooth signal is reset at a cadence of a frequency of the pulses that are modulated in width.

31 Claims, 3 Drawing Sheets

(56) References Cited

U.S. PATENT DOCUMENTS

| | | |
|---|---|---|
| 8,525,500 B1 | 9/2013 | Martin |
| 2008/0157742 A1 | 7/2008 | Martin |
| 2014/0132236 A1 | 5/2014 | Darmawaskita |
| 2016/0134295 A1 | 5/2016 | Kris |
| 2016/0294289 A1* | 10/2016 | Bui .................. G06F 1/266 |
| 2017/0257081 A1 | 9/2017 | Rosenberger et al. |

OTHER PUBLICATIONS

Infineon XMC4400 ARM(R) Cortex (tm)—M4 32-bit processor core, Ref. Manual, v1.5, Apr. 2014, High Resolution PWM Unit (HRPWM), Section 22.2 Functional Description, see in particular 22.2.2 (84 pages).

STMicroelectronics AN4885 Application Note: "High Brightness LED Dimming Using the STM32F334 Discovery Kit," Jun. 2014, DocID026292 Rev 1, 19 pages, refer to chapter 1.4.4 for slope compensation description and section 2.1 for DMA usage.

\* cited by examiner

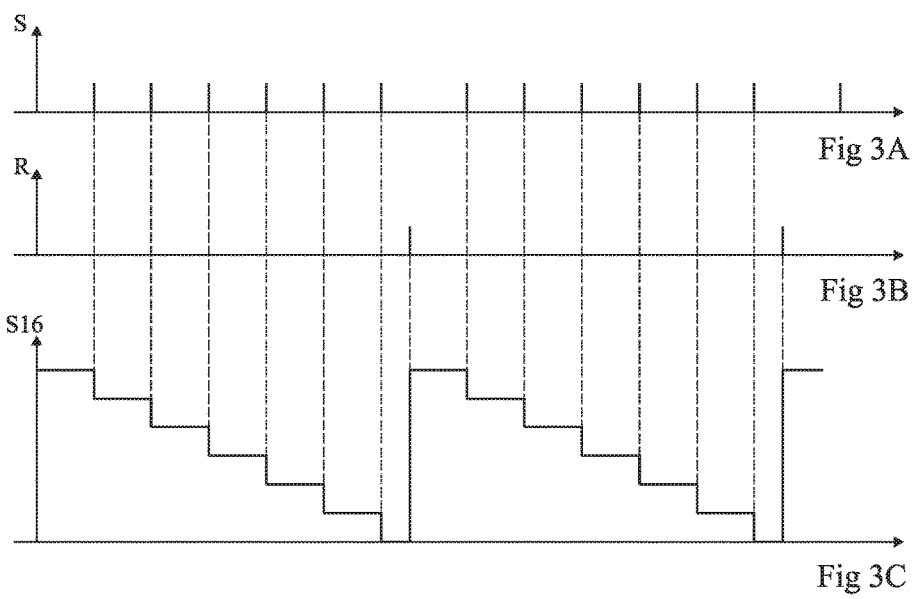
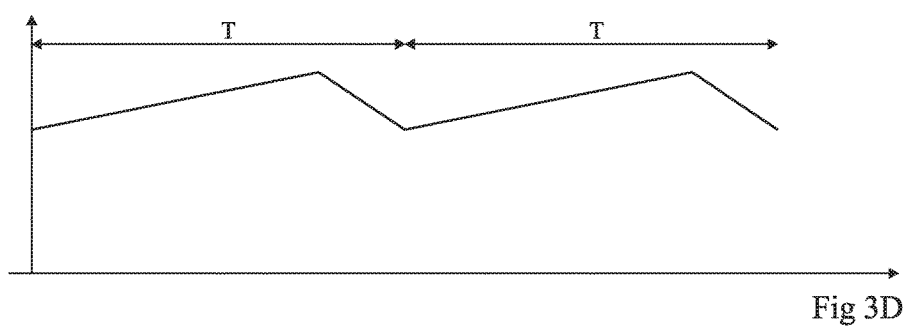

SWITCH-MODE POWER SUPPLY CONTROL

PRIORITY CLAIM

This application claims the priority benefit of French Application for Patent No. 1753897, filed on May 3, 2017, the disclosure of which is hereby incorporated by reference in its entirety to the maximum extent allowable by law.

TECHNICAL FIELD

The present description relates, in a general manner, to electronic circuits and, more particularly, to the field of switch-mode power supplies (SMPS). The present description relates more particularly to a slope-compensated digital-to-analog converter for controlling a switch-mode power supply. The present description also relates to a programmable digital-to-analog converter and a programmable generator of a decreasing sawtooth signal.

BACKGROUND

In power converters based on the principle of a switch-mode power supply, the closed-loop control of the output voltage onto a setpoint value is carried out by modulating the width of pulses of a control signal for a chopping switch for switching the transfer of energy into an inductive element. In the implementations targeted by the present description, the control is digital and the width of the pulses is obtained using a current ramp whose value is compared with a threshold. In certain cases, when the duty cycle of the control pulses reaches or is greater than 50%, the system becomes unstable.

Certain known solutions use tables of values stored in the converter, which constitute particularly complex solutions.

There is a need in the art for a slope-compensation function for controlling a switch-mode power supply and in particular controlling a slope-compensated digital-to-analog converter.

SUMMARY

In connection with the use of chopping switch control circuits for switch-mode power supplies, an embodiment provides a circuit suited to the control of a slope-compensated digital-to-analog converter. One embodiment provides a programmable digital-to-analog converter, for example a programmable generator of a decreasing sawtooth signal.

In an embodiment, a circuit for slope-compensation of a control signal for a module for generating pulses modulated in width comprises: a digital-to-analog converter for generating a sawtooth signal; and a circuit for triggering the steps of the sawtooth signal and for resetting this signal, the signal being reset at the cadence of a first frequency of the pulses modulated in width.

According to one embodiment, the triggering circuit is a digital circuit.

According to one embodiment, the triggering circuit comprises: at least one counter incremented at the cadence of a second frequency, higher than a frequency of modulation of the pulses; a first register for storing a value representative of the period of the first frequency; and a first comparator of the value of the counter with the value of the first register, the first comparator supplying a signal for resetting the sawtooth signal.

According to one embodiment, the triggering circuit further comprises: a second register whose value is incremented, at the cadence of the second frequency, by an increment value; and a second comparator of the value of the counter with the value of the second register, the second comparator supplying a signal for triggering a step of the sawtooth signal. According to one embodiment, the triggering circuit comprises a third register for storing the increment value.

According to one embodiment, the sawtooth signal has a decreasing slope.

According to one embodiment, the sawtooth signal has an increasing slope.

In an embodiment, a circuit for controlling a switch of a switch-mode power supply comprises: a circuit for generating pulses for controlling the switch; a comparator for generating a trigger signal for the circuit based on a comparison of information representative of the level of current in an inductive element controlled by the switch against a threshold; and a slope-compensation circuit.

In an embodiment, a switch-mode power supply circuit comprises: a chopping switch for switching an inductive transfer of energy; and a control circuit.

BRIEF DESCRIPTION OF THE DRAWINGS

These features and advantages, together with others, will be described in detail in the following description of particular embodiments, presented without limitation in relation with the appended figures, amongst which:

FIGS. 3A, 3B, 3C and 3D illustrate, by means of timing diagrams, the operation of the circuit in FIG. 2;

DETAILED DESCRIPTION

The same elements have been identified by the same references in the various figures.

For the sake of clarity, only the steps and elements useful to the understanding of the embodiments that will be described have been shown and will be detailed. In particular, the operation of a switch-mode power supply and of the conversion of energy per se has not been detailed, the embodiments described being compatible with the usual operation of a switch-mode power supply.

Unless otherwise stated, when reference is made to two elements connected together, this means directly connected without any intermediate element aside from the conductors, and when reference is made to two elements linked together, this means that these two elements may be directly linked (connected) or linked via one or more other elements.

In the description that follows, when reference is made to the terms "approximately", "around" and "of the order of", this means to the nearest 10%, preferably to the nearest 5%.

Figure 1:
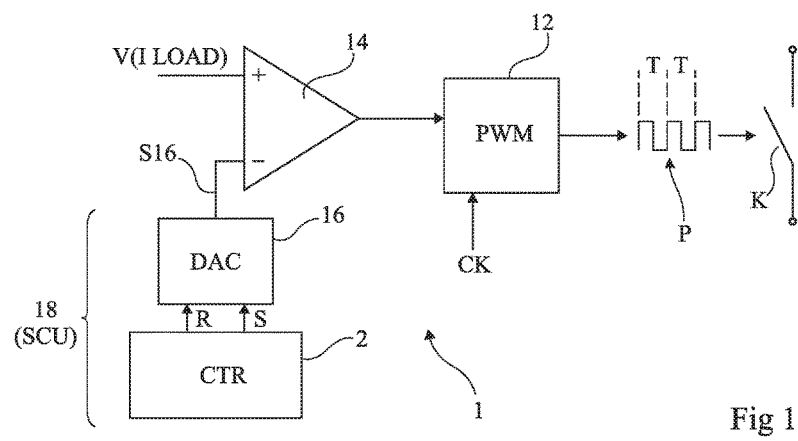
FIG. 1 is a very schematic and partial representation of one example of architecture of a switch-mode power supply of the type to which the embodiments described are applicable.

FIG. 1 is a schematic representation, in the form of blocks, of one embodiment of a control circuit 1 for a switch-mode power supply of the type to which the embodiments described are applicable.

The circuit 1 is designed to control a chopping switch K (generally an MOS transistor) for inductive transfer of energy. Depending on the embodiment, this switch is in parallel or in series with the inductive element and/or with a flywheel diode (not shown). The control of the switch K is carried out by a train of pulses of variable width, generally at a fixed frequency (period T). The duty cycle of the pulses fixes the duration of the energy transfer as a function of the needs of the load so as to maintain a supply voltage for this load.

The train of pulses is supplied by a pulse-width modulation (PWM) module 12 for pulses generated at the frequency of a clock CK. The width of the pulses (the duty cycle) is closed-loop controlled onto the needs of the load. These needs are, for example, deduced from a measurement of the supply voltage for the load or from a measurement of the current in this load or in the inductive element. In both cases, information V(ILOAD), proportional to the energy required by the load, is measured and is supplied at the input of a comparator 14 which compares it with a threshold representing the desired setpoint voltage. The output of the comparator 14 triggers the reset to zero of the current ramp generated by the module 12, hence the end of the pulse at each cycle.

According to the embodiment shown, the comparison reference for the comparator 14 is not fixed but is supplied by a slope-compensation unit (SCU) circuit 18 comprising a digital-to-analog converter 16 (DAC) controlled by a circuit 2 (CTR) for triggering the decreasing step of a sawtooth signal S16 generated by the converter 16. The role of the slope-compensation unit 18 is to supply, as a reference signal, to the comparator 14, a slope inverse to the slope generated by the module 12. Thus, even in the case of a stable output voltage which would have the tendency to cause instabilities in the signal P generated by the module 12, the reduction in the value used as a reference avoids this instability.

The triggering circuit 2 has the role of supplying, to the digital-to-analog converter 16, a signal R for resetting the voltage ramp and a signal S for triggering a reduction in the value of the ramp. In other words, the signal R is a signal of the same frequency as the frequency of the pulses P generated by the module 12 and the signal S is a decrement or step signal for the converter 16.

The triggering circuit 2 is a digital circuit, in other words it only processes digital signals and only supplies digital signals.

Figure 2:
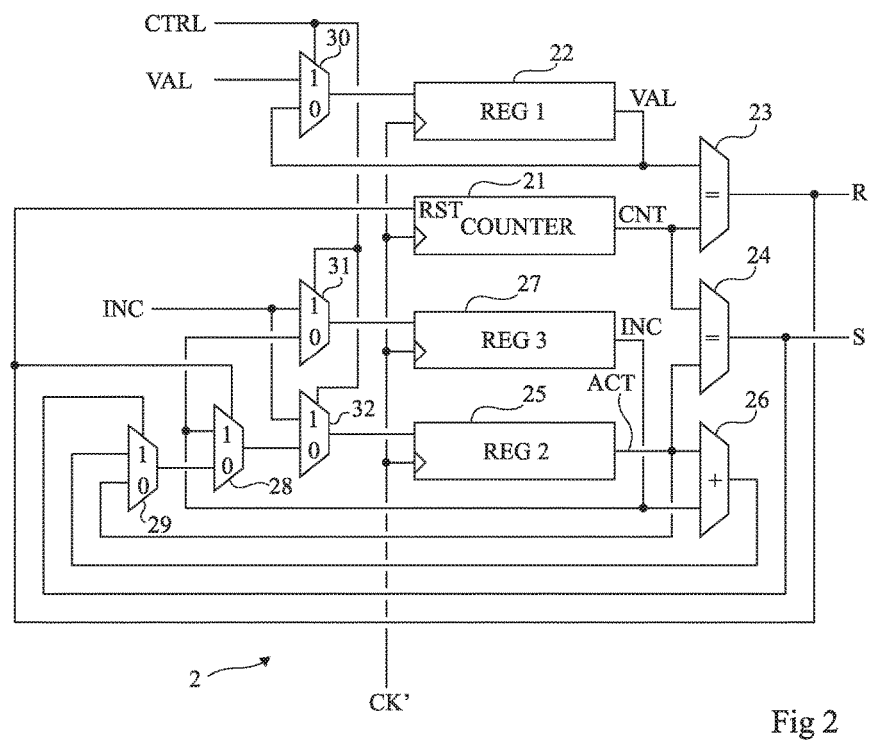
FIG. 2 shows, in the form of blocks, one embodiment of a circuit for controlling a digital-to-analog converter with slope-compensation of a current ramp for controlling a chopping switch.

FIG. 2 is a block diagram of one embodiment of a triggering circuit 2 for a digital-to-analog converter 16 of a unit 18 for slope-compensation of a control signal for a module 12 for generating pulses modulated in width.

The reset signal R is generated by a comparison of a value CNT of a counter 21 (COUNTER), incremented at the cadence of a clock CK', with a value VAL representing the desired reset period. The value VAL is stored in a register 22 (REG1). At each period (for example at each rising edge) of the clock signal CK', the respective values VAL and CNT are compared by a comparator 23 whose output (signal R) switches when the value of the counter reaches the value VAL. The counter 21 is reset at each end of a period T, in other words, each time that the output R switches into the high state. For this purpose, the output of the comparator 23 is connected to the reset input RST of the counter 21.

The decrement or step signal S for the current ramp generated by the converter 16 is supplied by a comparator 24 configured to compare the value CNT of the counter 21 with a value ACT supplied by a register 25 (REG2). The value contained in the register 25 is incremented by an adder 26, by an increment value INC stored in a register 27 (REG3). The current value ACT, read in the register 25, is increased by the value INC read in the register 27 when the value CNT of the counter 21 reaches the value ACT. The value ACT of the register 25 is reset to the value of the increment INC at each period T. A selector 28 (two-into-one multiplexer) receives, on an input activated by the signal R, the value INC contained in the register 27. At rest, the selector 28 selects the output of a selector 29 between the output of the adder 26 and the output of the register 25 (value ACT). The selector 29 is controlled by the signal S and selects the output of the adder 26 at each edge of the output S, in other words at each increment step INC. Thus, the output S produces an edge each time that the counter 21 reaches an increment step corresponding to the value INC.

According to one simplified embodiment, the increment value INC is equal to unity and the signal S is therefore incremented at each clock period CK'.

Preferably, the values VAL and INC of the circuit 2 are programmable in number of periods of the clock CK', which renders the circuit readily adaptable to various applications. In particular, the digital value VAL representing the period T of the pulses (the value VAL corresponds to the number of periods of the clock CK' contained within one period T) is a settable parameter. The value loaded into the register 22 (REG1) just needs to be changed. For this purpose, the output of the register 22 is for example connected to a first input of a selector 30 (two-into-one multiplexer). A second input of the multiplexer 30 is intended to receive the value VAL to be stored in the register 22 when the latter needs to be modified. The multiplexer 30 is controlled by an update signal CRTL selecting, for example in the active (asserted, high or 1) state, the value of the first input and, at rest (deasserted, low or 0), the output value of the register 22.

Furthermore, the increment value INC is also preferably a settable parameter. For this purpose, the output of the register 27 is for example connected to a first input of a selector 31 (two-into-one multiplexer). A second input of the multiplexer 31 is intended to receive the value INC to be stored in the register 27 when the latter needs to be modified. The multiplexer 31 is, for example, controlled by the signal CRTL (or by a signal independent of the signal CTRL) selecting, for example in the active (asserted, high or 1) state, the value of the first input and, at rest (deasserted, low or 0), the output value of the register 27. In the case of a change in the value INC, the latter must also be initialized in the register 25. For this purpose, a selector 32, whose output is linked to the input of the register 25, receives the signal INC on a first input and the output of the selector 28 on a second input. The selector 32 is controlled for example by the signal CTRL to re-load the new value INC into the register 25 at the same time as it is loaded into the register 27.

FIGS. 3A, 3B, 3C and 3D illustrate, by means of timing diagrams, the operation of the slope compensation unit circuit 18 in FIG. 1. FIGS. 3A, 3B and 3C show examples of respective profiles of the signals S, R and S16. FIG. 3D shows one example of a current ramp generated by the module 12.

It can be seen that the converter 16 generates a decreasing sawtooth ramp of period T with steps of width corresponding to the value of the increment INC (in number of clock strokes CK'). By using this ramp as comparison reference (threshold) for the comparator 14 (FIG. 1), the comparison voltage reference is lowered at the same time as the current ramp (FIG. 3D) rises, hence as time advances within the period T. Thus, if the voltage V(ILOAD), which is representative of the energy needs of the load, becomes too high with the risk of causing a duty cycle higher than 50%, the fact that the comparison reference is lower reduces the amplitude of the difference presented at the input of the module 12. This prevents the system from becoming unstable when the duty cycle exceeds 50%.

The value of the increment INC conditions the number of decrement steps of the voltage ramp supplied by the converter 16. According to one particular exemplary embodiment, between 4 and 50 steps are provided in one period T.

The choice of the voltage increment step of the converter 16 depends on the application and, in particular, on the range of variation of the voltage V(ILOAD).

The frequency of the clock CK' is, for example, equal to the frequency CK governing the pulse-width modulation step of the module 12 (FIG. 1).

Hereinabove, the example has been taken of a decreasing sawtooth signal S16. However, according to other embodiments, the converter 16 may generate an increasing sawtooth or triangular signal. This depends on the structure of the downstream circuits (comparator 14 and module 12) and on the slope-compensation profile that they require.

One advantage of the embodiments described is that they avoid the instability of the trains of pulses generated in the case of an increase in the duty cycle.

Another advantage is that the solution is digital and particularly simple to implement.

Another advantage is that the implementation of the solution described is compatible with the usual architectures for generating control signals in pulse-width modulation mode. Indeed, this implementation is only applied to the reference of the comparator 14 conditioning the width of the pulses.

Figure 4:
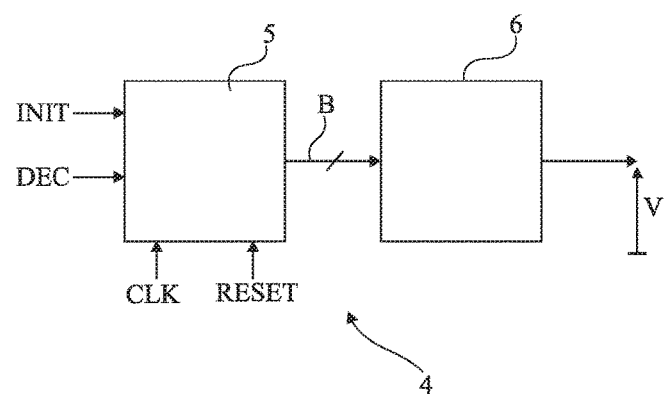
FIG. 4 is a block diagram of one embodiment of a programmable digital-to-analog converter.

FIG. 4 is a block diagram of one embodiment of a programmable digital-to-analog converter 4.

This generator may, for example, be used to form the converter 16 in FIG. 1 or to form a programmable generator of a decreasing sawtooth signal.

According to this embodiment, the converter comprises a digital stage 5 and an analog stage 6.

The digital stage 5 is a programmable digital circuit designed to supply bits (signal B) in parallel at the input of the analog stage operating the conversion per se. The analog stage 6 is a usual analog stage, for example composed of a network of current sources individually controlled by the bits of the signal B, of a network of switchable input resistors for an operational amplifier, etc.

The binary word B, supplied at the input of the stage 6, conditions the value of a voltage V supplied at the output of the converter 4. The step (the precision) of the converter depends on the number of bits in the signal B.

Figure 5:
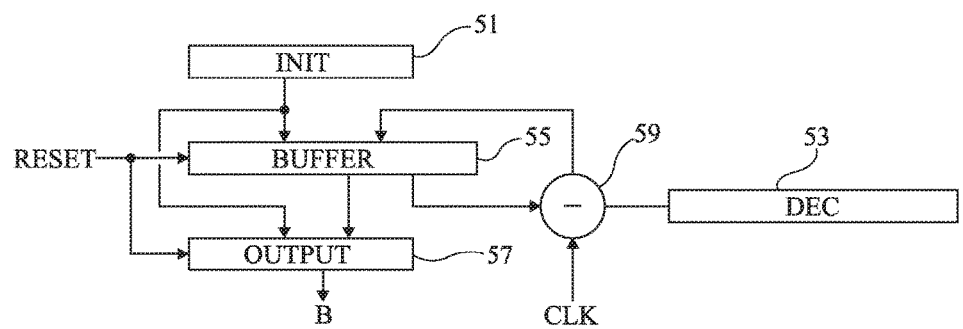
FIG. 5 shows, in the form of blocks, one embodiment of a digital stage of the generator in FIG. 4, designed to form a programmable generator of a decreasing sawtooth signal.

FIG. 5 shows, in the form of blocks, one embodiment of a digital stage 5 of the generator in FIG. 4, designed to form a programmable generator of a decreasing sawtooth signal.

The digital stage 5 constitutes, according to the embodiment shown, a programmable circuit comprising:
  a register 51 for storing a maximum value (INIT);
  a register 53 for storing a value (DEC) of decrement of the output word B, representing the decrement step of the output word B;
  a calculation register 55 (BUFFER);
  an output register 57 (OUTPUT) designed to contain the word B; and a subtractor 59 of the value of the decrement from the current value of the calculation register.

The digital stage 5 receives a signal CLK for triggering a decrement of the value B and a reset signal RESET.

The operation of the digital stage 5 is as follows. At each edge (for example rising edge) of the signal CLK, the contents of the registers 55 and 53 are read and the value DEC is subtracted from the content read in the register 55. The result is stored in the calculation register 55. At each edge (for example rising edge) of the signal RESET, the calculation register 55 and the output register 57 are reset to the value INIT read in the register 51. The content of the calculation register 55 is transferred, for example at each edge of the signal CLK, to the register 57. Thus, the register 57 contains, between two edges of the signal CLK, the value that has been loaded at the first of the two edges into the subtractor 59, which is therefore greater by a value DEC than the content of the calculation register 55.

The converter 4 in FIG. 4 may be used as a programmable converter supplying a given analog voltage. For this purpose, the number of decrements to be applied to the maximum value is chosen.

The generator 4 may also be used as a programmable generator of a sawtooth signal. Depending on the values INIT and DEC chosen, for a given clock CLK, the decrement frequency and the maximum amplitude of the sawtooth signal are fixed.

According to one preferred embodiment, the number of bits in the decrement register 53 and calculation register 55 is greater than the number of bits in the registers 51 and 57. The bits of the register 51 are used as most-significant bits for the initialization of the calculation register 55. The most-significant bits of the register 55 are used to update the output register 57. One advantage is that this avoids the rounding errors in that only the most-significant bits are used. By way of one particular exemplary embodiment, the registers 51 and 57 are over twelve bits and the registers 53 and 55 are over sixteen bits.

According to one particular exemplary embodiment, the signals RESET and CLK respectively correspond to the signals R and S generated by the circuit 2 (FIG. 2).

Various embodiments have been described, various variants and modifications will become apparent to those skilled in the art. In particular, the choice of the values to be stored in the various registers and the choice of the frequencies of the trigger signals depend on the application and their determination is achievable by those skilled in the art. Furthermore, the practical implementation of the embodiments and the dimensioning of the components are achievable by those skilled in the art based on the functional description given hereinabove.

The invention claimed is:

1. A circuit for slope-compensation of a control signal for a modulation circuit configured to generate pulses that are modulated in width, comprising:
  a digital-to-analog converter configured to generate a sawtooth signal; and
  a triggering circuit configured to trigger steps of the sawtooth signal and reset the sawtooth signal, wherein the sawtooth signal is reset at a cadence of a first frequency of the pulses that are modulated in width, wherein the triggering circuit comprises:
    a counter incremented at a cadence of a second frequency, wherein the second frequency is higher than the first frequency;
    a first register configured to store a value representative of a period of the first frequency; and a first comparator configured to compare a value of the counter with the value of the first register and generate a signal for resetting the sawtooth signal in response to the comparison.

2. The circuit according to claim 1, wherein the triggering circuit is a digital circuit.

3. The circuit according to claim 1, wherein the triggering circuit further comprises:
a second register having a value that is incremented at the cadence of the second frequency by an increment value; and
a second comparator configured to compare the value of the counter with the value of the second register and generate a signal for triggering a step of the sawtooth signal.

4. The circuit according to claim 3, wherein the triggering circuit comprises a third register configured to store the increment value.

5. The circuit according to claim 1, wherein the sawtooth signal has a decreasing slope.

6. The circuit according to claim 1, wherein the sawtooth signal has an increasing slope.

7. A circuit for controlling a switch of a switch-mode power supply, comprising:
a pulse generating circuit configured to generate pulses for controlling the switch, said pulses having a width determined by a current ramp that is reset by a control signal;
a comparator circuit configured to generate said control signal which resets the current ramp of the pulse generating circuit based on a comparison of information representative of a level of current in an inductive element controlled by the switch against a sawtooth signal; and
a slope-compensation circuit, comprising:
a digital-to-analog converter configured to generate said sawtooth signal; and
a triggering circuit configured to trigger steps of the sawtooth signal and reset the sawtooth signal, wherein the sawtooth signal is reset at a cadence of a first frequency of the pulses for controlling the switch.

8. The circuit according to claim 7, wherein the triggering circuit is a digital circuit.

9. The circuit according to claim 7, wherein the triggering circuit comprises:
a counter incremented at a cadence of a second frequency, wherein the second frequency is higher than the first frequency;
a first register configured to store a value representative of a period of the first frequency; and
a first comparator configured to compare a value of the counter with the value of the first register and generate a signal for resetting the sawtooth signal in response to the comparison.

10. The circuit according to claim 9, wherein the triggering circuit further comprises:
a second register having a value that is incremented at the cadence of the second frequency by an increment value; and
a second comparator configured to compare the value of the counter with the value of the second register and generate a signal for triggering a step of the sawtooth signal.

11. The circuit according to claim 10, wherein the triggering circuit comprises a third register configured to store the increment value.

12. The circuit according to claim 7, wherein the sawtooth signal has a decreasing slope during a same time period when the current ramp has an increasing slope.

13. The circuit according to claim 7, wherein the sawtooth signal has an increasing slope during a same time period when the current ramp has a decreasing slope.

14. A switch-mode power supply circuit, comprising:
a chopping switch configured to switch an inductive transfer of energy in response to a pulse signal; and
a control circuit configured to generate said pulse signal to include pulses having a width determined by a current ramp that is reset by a control signal, wherein the control circuit comprises:
a comparator circuit configured to generate said control signal for controlling generation of said pulse signal which resets the current ramp based on a comparison of information representative of a level of current in an inductive element controlled by the chopping switch against a sawtooth signal; and
a slope-compensation circuit, comprising:
a digital-to-analog converter configured to generate said sawtooth signal; and
a triggering circuit configured to trigger steps of the sawtooth signal and reset the sawtooth signal, wherein the sawtooth signal is reset at a cadence of a first frequency of the pulse signal.

15. The circuit according to claim 14, wherein the triggering circuit comprises:
a counter incremented at a cadence of a second frequency, wherein the second frequency is higher than the first frequency;
a first register configured to store a value representative of a period of the first frequency; and
a first comparator configured to compare a value of the counter with the value of the first register and generate a signal for resetting the sawtooth signal in response to the comparison.

16. The circuit according to claim 15, wherein the triggering circuit further comprises:
a second register having a value that is incremented at the cadence of the second frequency by an increment value; and
a second comparator configured to compare the value of the counter with the value of the second register and generate a signal for triggering a step of the sawtooth signal.

17. The circuit according to claim 16, wherein the triggering circuit comprises a third register configured to store the increment value.

18. A circuit, comprising:
a digital-to-analog converter configured to generate a sawtooth signal that is reset in response to a reset signal and step changed in response to a trigger signal; and
a triggering circuit configured to generate the reset signal and the trigger signal, said triggering circuit comprising:
a first register configured to store a first value defining a period of the sawtooth signal that is related to a first frequency;
a counter configured to count at a second frequency and output a count value;
a first comparator configured to assert the reset signal when the count value equals the first value, the reset signal further causing the counter to reset;
a second register configured to store a second value that is incremented by an increment value at the second frequency; and a second comparator configured to assert the trigger signal when the count value equals the second value.

19. The circuit of claim 18, further comprising:
a third register configured to store the increment value; and
a summation circuit configured to add the increment value to the second value and store a summed value in the second register as the second value in response to assertion of the trigger signal.

20. The circuit of claim 19, wherein the summation circuit is further configured to store the summed value in the second register as the second value in response to both the assertion of the trigger signal and a deassertion of the reset signal.

21. The circuit of claim 18, wherein the first and second registers and the counter are driven by a common clock signal at the second frequency.

22. The circuit of claim 18, further comprising a load circuit configured to load the first register with the first value.

23. The circuit of claim 18, further comprising a load circuit configured to load the second register with an initial value for the second value.

24. A circuit for controlling a switch of a switch-mode power supply, comprising:
a pulse generating circuit configured to generate pulses for controlling the switch;
a comparator circuit configured to generate a control signal applied to the pulse generating circuit based on a comparison of information representative of a level of current in an inductive element controlled by the switch against a threshold; and
a slope-compensation circuit, comprising:
a digital-to-analog converter configured to generate a sawtooth signal; and
a triggering circuit configured to trigger steps of the sawtooth signal and reset the sawtooth signal, wherein the sawtooth signal is reset at a cadence of a first frequency of the pulses for controlling the switch, wherein the triggering circuit comprises:
a counter incremented at a cadence of a second frequency, wherein the second frequency is higher than the first frequency;
a first register configured to store a value representative of a period of the first frequency; and
a first comparator configured to compare a value of the counter with the value of the first register and generate a signal for resetting the sawtooth signal in response to the comparison.

25. The circuit according to claim 24, wherein the triggering circuit is a digital circuit.

26. The circuit according to claim 24, wherein the triggering circuit further comprises:
a second register having a value that is incremented at the cadence of the second frequency by an increment value; and
a second comparator configured to compare the value of the counter with the value of the second register and generate a signal for triggering a step of the sawtooth signal.

27. The circuit according to claim 26, wherein the triggering circuit comprises a third register configured to store the increment value.

28. The circuit according to claim 24, wherein the sawtooth signal has a decreasing slope.

29. The circuit according to claim 24, wherein the sawtooth signal has an increasing slope.

30. The circuit according to claim 14, wherein the sawtooth signal has a decreasing slope during a same time period when the current ramp has an increasing slope.

31. The circuit according to claim 14, wherein the sawtooth signal has an increasing slope during a same time period when the current ramp has a decreasing slope.

* * * * *